(12) United States Patent
Xu et al.

(10) Patent No.: US 10,014,330 B2
(45) Date of Patent: Jul. 3, 2018

(54) ARRAY SUBSTRATE, METHOD FOR FABRICATING THE SAME, AND DISPLAY APPARATUS CONTAINING THE SAME

(71) Applicants: BOE TECHNOLOGY GROUP CO., LTD, Beijing (CN); CHONGQING BOE OPTOELECTRONICS TECHNOLOGY CO., LTD, Chongqing (CN)

(72) Inventors: Zhuo Xu, Beijing (CN); Jaikwang Kim, Beijing (CN); Fei Shang, Beijing (CN); Yajie Bai, Beijing (CN); Rui Wang, Beijing (CN)

(73) Assignees: BOE TECHNOLOGY GROUP CO., LTD, Beijing (CN); CHONGQING BOE OPTOELECTRONICS TECHNOLOGY CO., LTD, Chongqing (CN)

( * ) Notice: Subject to any disclaimer, the term of this patent is extended or adjusted under 35 U.S.C. 154(b) by 0 days.

(21) Appl. No.: 15/325,459

(22) PCT Filed: Jul. 1, 2016

(86) PCT No.: PCT/CN2016/088177
§ 371 (c)(1),
(2) Date: Jan. 11, 2017

(87) PCT Pub. No.: WO2017/012462
PCT Pub. Date: Jan. 26, 2017

(65) Prior Publication Data
US 2017/0207252 A1 Jul. 20, 2017

(30) Foreign Application Priority Data
Jul. 20, 2015 (CN) .......................... 2015 1 0426617

(51) Int. Cl.
*H01L 27/12* (2006.01)
*G02F 1/1343* (2006.01)

(52) U.S. Cl.
CPC ........ *H01L 27/1255* (2013.01); *H01L 27/124* (2013.01); *H01L 27/1288* (2013.01)

(58) Field of Classification Search
CPC ............... H01L 27/1255; H01L 27/124; H01L 27/1288; G02F 1/1343
See application file for complete search history.

(56) References Cited

U.S. PATENT DOCUMENTS

2006/0001814 A1 1/2006 Paik et al.
2006/0118828 A1 * 6/2006 Kim ................. G02F 1/134363
257/213

(Continued)

FOREIGN PATENT DOCUMENTS

| CN | 103176320 A | 6/2013 |
| CN | 103187422 A | 7/2013 |

(Continued)

OTHER PUBLICATIONS

The World Intellectual Property Organization (WIPO) International Search Report for PCT/CN2016/088177 dated Sep. 2, 2016 p. 1-14.

*Primary Examiner* — Sitaramarao S Yechuri
(74) *Attorney, Agent, or Firm* — Anova Law Group, PLLC

(57) ABSTRACT

The present disclosure provides an array substrate, including: a plurality of gate lines and a plurality of data lines intersecting with one another for defining a plurality of pixel regions, each pixel region including two pixel units, each pixel unit including a pixel electrode; and a common electrode line and a pixel electrode line, the pixel electrode line being electrically connected to the pixel electrode. The common electrode line and at least one pixel electrode line (Continued)

form at least an overlapping area for forming at least one storing capacitor there-between.

18 Claims, 4 Drawing Sheets

(56) References Cited

U.S. PATENT DOCUMENTS

| | | |
|---|---|---|
| 2007/0103611 A1 | 5/2007 | Park et al. |
| 2009/0040413 A1* | 2/2009 | Chen .................. G02F 1/13624 349/48 |
| 2011/0149184 A1* | 6/2011 | Tsai .................. G02F 1/136213 349/38 |

FOREIGN PATENT DOCUMENTS

| | | |
|---|---|---|
| CN | 104570530 A | 4/2015 |
| CN | 104950540 A | 9/2015 |

\* cited by examiner

ARRAY SUBSTRATE, METHOD FOR FABRICATING THE SAME, AND DISPLAY APPARATUS CONTAINING THE SAME

CROSS-REFERENCES TO RELATED APPLICATIONS

This application is a national phase entry under 35 U.S.C. § 371 of International Application No. PCT/CN2016/088177, filed on Jul. 1, 2016, which claims priority to Chinese Patent Application No. 201510426617.4 filed on Jul. 20, 2015. The above enumerated patent applications are incorporated by reference herein in their entirety.

TECHNICAL FIELD

The present invention generally relates to the display technologies and, more particularly, relates to an array substrate, a method for fabricating the array substrate, and a display apparatus containing the array substrate.

BACKGROUND

In an existing array substrate, pixel electrodes and common electrodes lines are often overlapped to foul' storing capacitors. A common electrode line refers to a metal line/wire connected to a common electrode. For example, a common electrode line may be disposed at the via hole that connects the drain of the driving thin-film transistor (TFT) and the pixel electrode, so that the common electrode line may have overlapping areas with the pixel electrode. Storing capacitors may be formed between the pixel electrode and the common electrode line.

However, the area of the pixel electrode corresponding to a via hole is often limited, so that the common electrode line requires a greater width to form storing capacitors with higher capacitance. Also, it is difficult to obtain both a desired aperture ratio and storing capacitors with desired capacitance in an existing array substrate.

BRIEF SUMMARY

The present disclosure provides an array substrate, a method for fabricating the array substrate, and a display apparatus containing the array substrate. By using the structure and method provided by the present disclosure, the capacitance of the storing capacitor can be increased/improved without impairing the aperture ratio of the pixel region.

One aspect of the present disclosure provides an array substrate, including: a plurality of gate lines and a plurality of data lines intersecting with one another for defining a plurality of pixel regions, each pixel region including two pixel units, each pixel unit including a pixel electrode; and a common electrode line and a pixel electrode line, the pixel electrode line being electrically connected to the pixel electrode. The common electrode line and at least one pixel electrode line form at least an overlapping area for forming at least one storing capacitor there-between.

Optionally, two pixel electrode lines substantially overlap with the common electrode line.

Optionally the common electrode line and the pixel electrode line are between adjacent pixel units, the common electrode line and the at least one pixel electrode line being aligned substantially parallel with the data lines.

Optionally, a row of pixel units is divided into a plurality of pixel unit groups, each pixel unit group containing two adjacent pixel units; a first gate line is above each row of pixel units and a second gate line is below each row of pixel units, each of the first gate line and the second gate line being configured to drive a different one of the two adjacent pixel units in each pixel unit group; and the two adjacent pixel units in each pixel unit group are connected to a same data line or different data lines, the common electrode line and the at least one pixel electrode line being between adjacent pixel unit groups.

Optionally, the at least one pixel electrode line includes a first pixel electrode line and a second pixel electrode line, the first pixel electrode line being electrically connected to a pixel electrode of a first pixel unit and the second pixel electrode line being electrically connected to a pixel electrode of a second pixel unit, and the first pixel unit and the second pixel unit being adjacent to each other and contained in different pixel unit groups in a same row.

Optionally, the pixel unit further includes a thin-film transistor with a gate electrode, an active layer, and a source and drain electrode, the gate electrode being connected to a gate line, the source electrode being connected to a data line, and the drain electrode being connected to a pixel electrode and a pixel electrode line.

Optionally, the common electrode line and the gate lines are formed in a same fabrication step and are made of a same material; and the at least one pixel electrode line and the data lines are formed through a same fabrication step and are made of a same material.

Optionally, the array substrate further includes a passivation layer and extended pixel electrode portions. The passivation layer is on the data lines and the pixel electrodes are on the passivation layer; and the extended pixel electrode portions are on the passivation layer and electrically connected to corresponding pixel electrodes, the extended pixel electrode portions and the common electrode line forming at least an overlapping area for forming storing capacitors.

Optionally, the common electrode line and the at least one pixel electrode line are between adjacent columns of pixel units.

Optionally, the common electrode line and the at least one pixel electrode line are between every two columns of pixel units.

Another aspect of the present disclosure provides a display apparatus, including one or more of the disclosed array substrates.

Another aspect of the present disclosure provides a method for fabricating an array substrate, including forming a plurality of gate lines and a plurality of data lines, the plurality of gate lines intersecting with the plurality of data lines to define a plurality of pixel regions, each pixel region including two pixel units, each pixel unit including a pixel electrode; forming a common electrode line, the common electrode line being aligned substantially parallel with the data lines; forming an insulating layer on the common electrode; and forming a plurality of pixel electrode lines, the pixel electrode lines being electrically connected to the pixel electrodes, wherein the common electrode line and at least one pixel electrode line form at least an overlapping area for forming at least one storing capacitor there-between.

Optionally, forming the common electrode lines and the pixel electrode lines including forming a common electrode line and at least one pixel electrode line between adjacent pixel units, the common electrode line and the at least one pixel electrode line being aligned substantially parallel with the data lines.

Optionally, forming the common electrode lines and the pixel electrode lines including forming a common electrode line and at least one pixel electrode line between adjacent columns of pixel units, the common electrode line and the at least one pixel electrode line being substantially parallel with the data lines.

Optionally, forming the common electrode lines and the pixel electrode lines including forming a common electrode line and at least one pixel electrode line between every two columns of pixel units, the common electrode line and the at least one pixel electrode line being substantially parallel with the data lines.

Optionally, the method further includes dividing a row of pixel units into a plurality of pixel unit groups, each pixel unit group containing two adjacent pixel units; forming a first gate line over each row of pixel units and a second gate line below each row of pixel units, the first gate line and the second gate line each being configured to drive a different one of the two adjacent pixel units in each pixel unit group; and connecting the two adjacent pixel units in each pixel unit group to a same data line or different data lines, the common electrode line and at least one pixel electrode line being disposed between adjacent pixel unit groups.

Optionally, forming the at least one pixel electrode line includes: forming a first pixel electrode line and a second pixel electrode line, the first pixel electrode line being electrically connected to a pixel electrode of a first pixel unit and the second pixel electrode line being electrically connected to a pixel electrode of a second pixel unit, and the first pixel unit and the second pixel being adjacent to each other and contained in different pixel unit groups in a same row.

Optionally, the method further includes forming a thin-film transistor with a gate electrode, an active layer, and a source and drain electrode, the gate electrode being connected to a gate line, the source electrode being connected to a data line, and the drain electrode being connected to a pixel electrode and a pixel electrode line.

Optionally, the common electrode line and the gate lines are formed in a same fabrication step and are made of a same material; and the at least one pixel electrode line and the data lines are formed through a same fabrication step and are made of a same material.

Optionally, the method further includes forming a passivation layer and extended pixel electrode portions. The passivation layer is disposed on the data lines and the pixel electrodes are disposed on the passivation layer; and the extended pixel electrode portions are disposed on the passivation layer and electrically connected to pixel electrodes, the extended pixel electrode portions forming at least one storing capacitor with the common electrode line.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

It should be noted that, for illustrative purposes and viewing simplicity, figures of the present disclosure may only show the portions of the common electrode lines and the pixel electrode lines that are aligned substantially along or substantially parallel with the direction the data lines are aligned, e.g., substantially along or substantially parallel with the data lines. Portions of the common electrode lines and the pixel electrode lines aligned in other directions, e.g., being substantially perpendicular to the length direction of the data lines, may not be shown in the figures for viewing simplicity.

Figure 1:
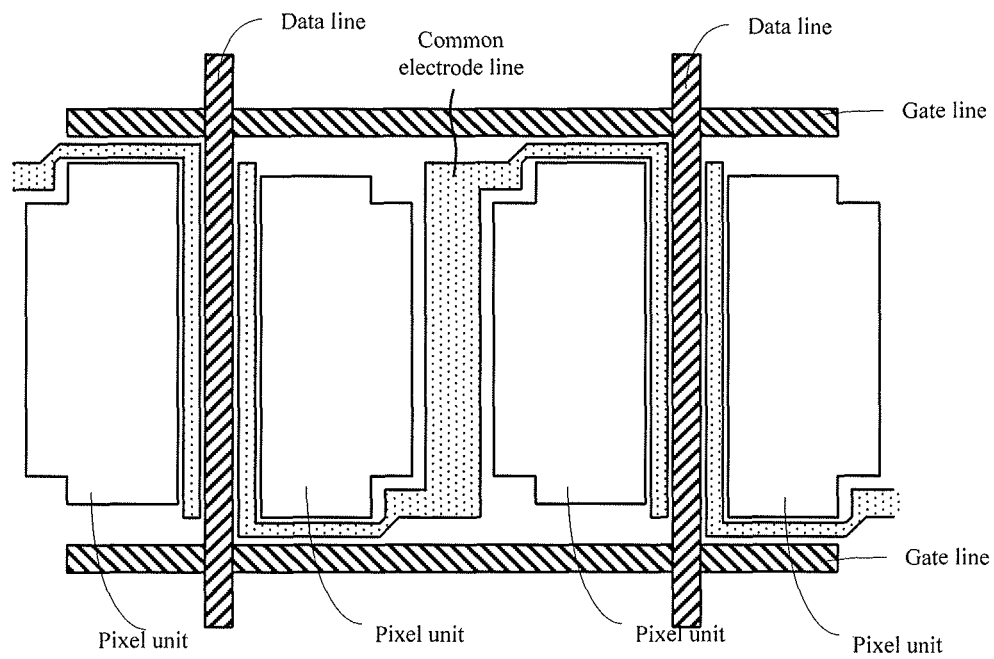
FIG. 1 illustrates an existing array substrate.

As mentioned before, common electrode line requires a greater width to form storing capacitors with higher capacitance. Further, for example, in an array substrate with double-gate structures shown in FIG. 1, to increase the capacitance of the array substrate, additional storing capacitors may be formed around or neighboring the pixel units. Thus, the structure described increases the capacitance of the storing capacitors, and causes the aperture ratio of the pixel region to decrease. As a result, it is difficult to obtain both a desired aperture ratio and storing capacitors with desired capacitance in an existing array substrate.

One aspect of the present disclosure provides an array substrate. The array substrate includes a plurality of gate lines and a plurality of data lines intersecting with each other for defining a plurality of pixel units, each pixel unit including a pixel electrode; and a common electrode line and a plurality of pixel electrode lines, aligned substantially parallel with the data lines, the pixel electrode line being electrically connected to the pixel electrode. The common electrode line and at least one corresponding pixel electrode line form at least an overlapping area in between and may form at least one storing capacitor there-between.

Figure 2:
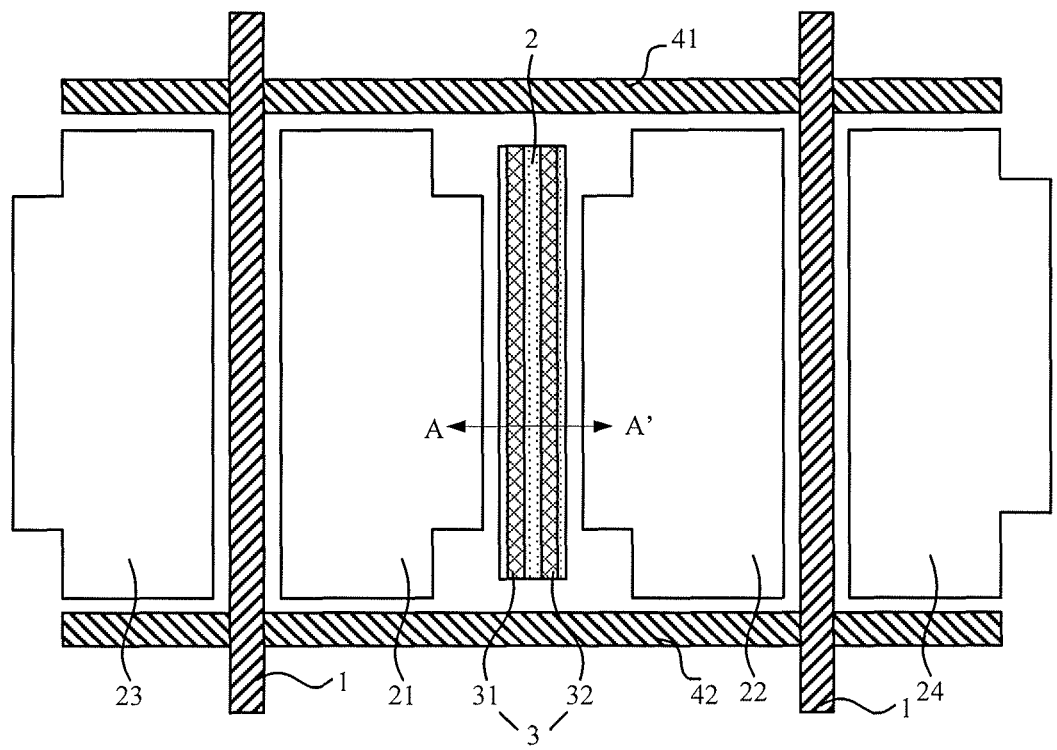
FIG. 2 illustrates an exemplary array substrate according to various disclosed embodiments of the present disclosure.

FIG. 2 illustrates an exemplary array substrate according to various disclosed embodiments of the present disclosure. For example, FIG. 2 illustrates a general view of main components described in the present disclosure and FIG. 3 illustrates a cross-sectional view of the structure substantially along the AA' direction, which includes an exemplary structure of a common electrode line 2 and its corresponding pixel electrode lines 3.

Figure 3:
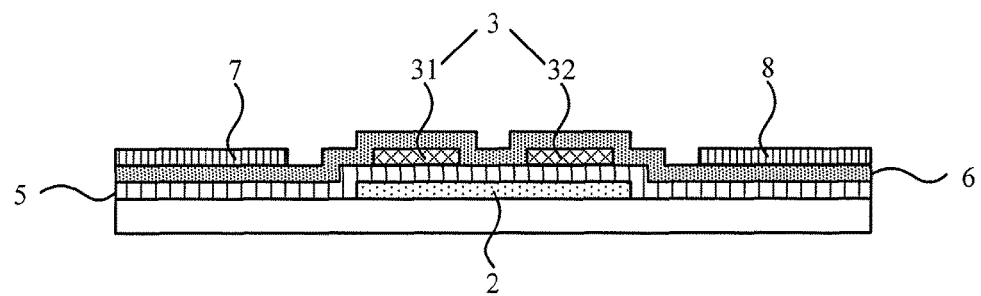
FIG. 3 illustrates a cross-sectional view of an exemplary structure substantially along the AA' direction in FIG. 2 according to various disclosed embodiments of the present disclosure.
Figure 4:
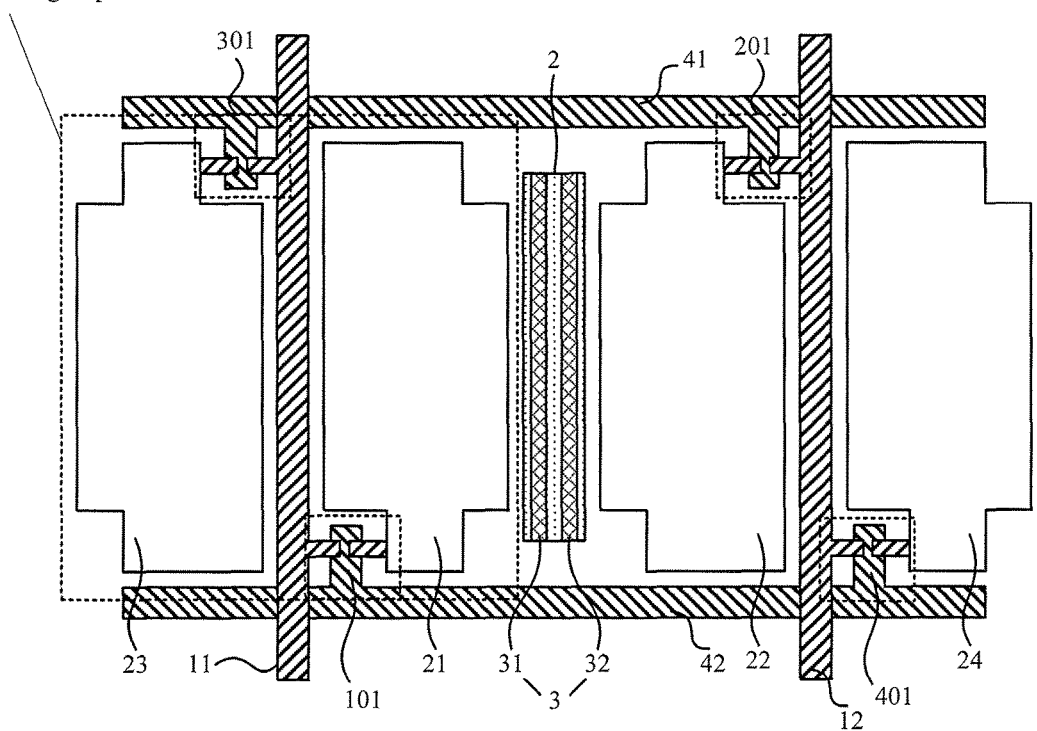
FIG. 4 illustrates another exemplary array substrate according to various disclosed embodiments of the present disclosure.
Figure 5:
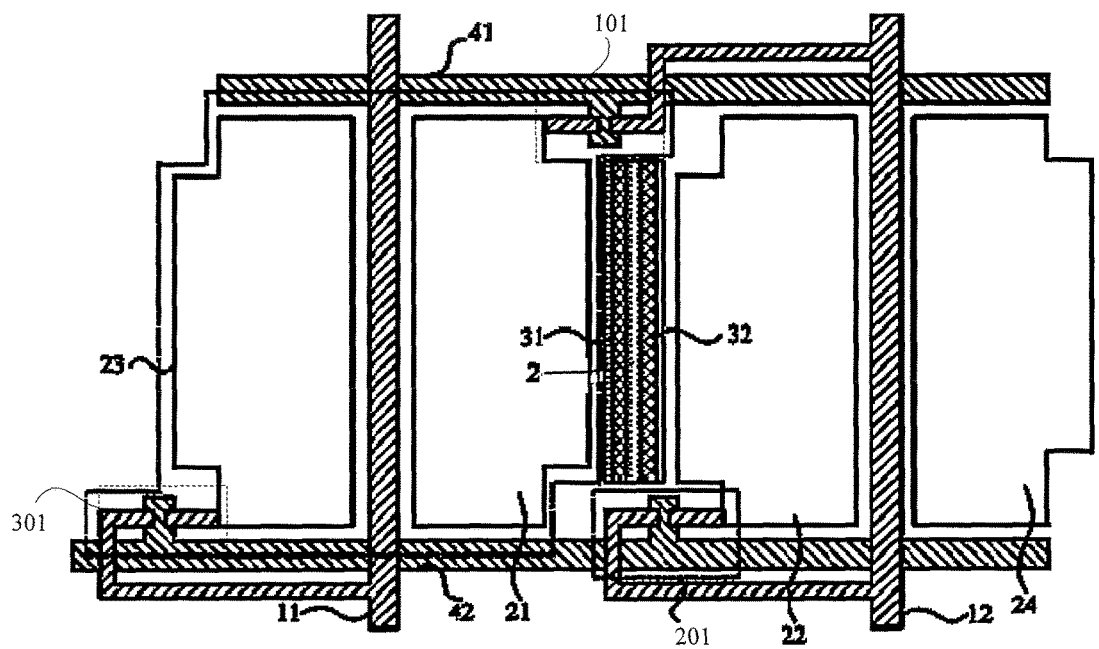
FIG. 5 illustrates another exemplary array substrate according to various disclosed embodiments of the present disclosure.

As shown in FIGS. 2 and 3, the array substrate provided by the present disclosure may include a plurality of gate lines 4 (shown as the gate lines 41 and 42 in FIGS. 2, 4, and 5) and a plurality of data lines 1 (shown as the data lines 1 in FIG. 2, and data lines 11 and 12 in FIGS. 4 and 5). The plurality of gate lines 4 may intersect with the plurality of data lines 1 to define a plurality of pixel regions. A pixel region may include two pixel units. A pixel unit may include a pixel electrode. In various embodiments, more data lines and more gate lines may be included.

As described herein, two or more objects may intersect with each other, and the intersecting objects may refer to objects having orthogonal projections on the substrate that intersect with each other. In other words, orthogonal projections, on the substrate, of the two or more objects are not in parallel with each other. In some cases, the two or more objects may be disposed in different planes and the term "intersect" may refer to indirect contact of the two or more objects.

As illustrated in FIG. 2, the array substrate may also include a plurality of common electrode lines 2 and a plurality of pixel electrode lines 3. The common electrode lines 2 and the pixel electrode lines 3 may be aligned substantially along the length direction of the data lines 1, e.g., may be parallel to the data lines 1. A pixel electrode line may be connected to a pixel electrode. A common electrode line 2 and a corresponding pixel electrode line 3 may be separated or insulated from each other by an insulating layer. At least an overlapping area may be formed between the common electrode line 2 and the corresponding pixel electrode line 3 such that storing capacitors may be formed between a common electrode line 2 and one or more corresponding pixel electrode lines 3. For illustrative purposes, only one common electrode line 2 and two corresponding pixel electrode lines 3 are shown in the figures, such as FIG. 2, of the present disclosure.

Compared to an existing array substrate, e.g., with storing capacitors formed in the via hole regions connecting the drains and the corresponding pixel electrodes, the disclosed array substrate may include storing capacitors formed between pixel electrode lines 3 and common electrode lines 2. Because pixel electrode lines 3, i.e., the metal lines connected with the pixel electrodes, and the common electrode lines 2, i.e., the metal lines connected with the common electrodes, are aligned substantially along the length direction of the data lines 1, more space can be formed for the pixel electrode lines 3 and the common electrode lines 2. Longer pixel electrode lines 3 and longer common electrode lines 2 may be formed. Larger overlapping areas between a pixel electrode line 3 and a corresponding common electrode line 2 can be formed. Storing capacitors with higher capacitance can be formed.

Also, with greater lengths, the pixel electrode lines 3 and the common electrode lines 2 may have smaller widths than forming storing capacitor with the same capacitance as an existing storing capacitor. Blocking of the pixel region may be reduced, and the pixel region may have higher aperture ratio or light transmission rate. Thus, the power consumption of the backlight light source may be reduced.

According to the present disclosure, a desired aperture ratio of the pixel region may be ensured by controlling the widths of the common electrode lines 2 and the pixel electrode lines 3. Meanwhile, the overlapping areas between a common electrode line 2 and the corresponding pixel electrode lines 3 may be increased. Capacitance of storing capacitors may be increased.

It should be noted that, the common electrode lines 2 and the pixel electrode lines 3 in the disclosed embodiments are aligned substantially along the length direction of the data lines 1. The common electrode lines 2 and the pixel electrode lines 3 may be fabricated to be straight lines, which are parallel to the data lines 1, to simplify the fabrication process of the array substrate. Also, in certain embodiments, the common electrode lines 2 and the pixel electrode lines 3 may be curved lines or broken lines to ensure the common electrode lines 2 and the pixel electrode lines 3 are aligned substantially along the length direction of the data lines 1 to increase the overlapping areas between a common electrode line 2 and the corresponding pixel electrode lines 3. The capacitance of the storing capacitor formed between the common electrode lines 2 and the pixel electrode lines 3 may be increased. It should be noted that, the specific shapes and alignment directions of the common electrode lines 2 and the pixel electrode lines 3 may be determined according to different applications and designs, and should not be limited according to various embodiments of the present disclosure.

In some embodiments, a common electrode line 2 and the corresponding pixel electrode lines 3 may be positioned between adjacent pixel units.

In some embodiments, a common electrode line 2 and the corresponding pixel electrode lines 3 may be positioned between two adjacent columns of pixel units.

In some embodiments, a column of common electrode lines 2 and corresponding pixel electrode lines 3 may be arranged between every two columns of pixel units. The specific numbers and distribution of the common electrode lines 2 and the pixel electrode lines 3 may be determined based on the cost of fabrication and the uniformity of the array substrate, and should not be limited according to various embodiments of the present disclosure.

In some embodiments, each row of pixel units may be divided into a plurality of pixel unit groups. Each pixel unit group may include two adjacent pixel units, and each pixel unit may only be contained in one pixel unit group. As shown in FIG. 4, four pixel units aligned in one row are described as an example. The first pixel unit 21, the second pixel unit 22, the third pixel unit 23, and the fourth pixel unit 24 may be in a same row. The first pixel unit 21 may be adjacent to the second pixel unit 22. The second pixel unit 22 may be adjacent to the fourth pixel unit 24. The third pixel unit 23 may be adjacent to the first pixel unit 21. The gate lines 4 may form a pixel region with the data lines 1. The pixel region may include the first pixel unit 21 and the second pixel unit 22. The first pixel unit 21 and the third pixel unit 23 may form a pixel unit group, as indicated by a dashed box shown in FIG. 4. The second pixel unit 22 and the fourth pixel unit 24 may form another pixel unit group.

In some embodiments, the common electrode lines 2 and the pixel electrode lines 3 may be disposed in different layers, e.g., the common electrode lines 2 may be disposed in a layer under the layer the pixel electrode lines 3 are disposed. In some embodiments, the orthogonal projection of a pixel electrode line 3 on the substrate may be at least partially within the orthogonal projection of a common electrode line 2 on the substrate. In some embodiments, the width of a common electrode line 2 may be larger than or equal to the width of a pixel electrode line 3.

As shown in FIG. 4, a first gate line 41 may be disposed above each row of pixel units. A second gate line 42 may be disposed below each row of pixel units. The first gate line 41 and the second gate line 42 may each be used to drive the two pixel units from different pixel unit groups. For example, the first gate line 41 may be used to drive the third pixel unit 23 and the second pixel unit 22. The second gate line 42 may be used to drive the first pixel unit 21 and the fourth pixel unit 24.

The disclosed array substrate may be used in array substrates driven by regular dual-gate drivers. FIG. 4 illustrates an exemplary configuration of the array substrate.

Pixels in the array substrate shown in FIG. 4 are driven by regular dual-gate drivers. As shown in FIG. 4, the two pixel units contained in a same pixel unit group may be connected to a same data line 1, and pixel units contained in different pixel unit groups may each be connected to a different data line. For example, the first pixel unit 21 and the third pixel unit 23 may be in the same pixel unit group. The TFT 101 of the first pixel unit 21 may be located on the lower left side of the first pixel unit 21. The TFT 301 of the third pixel unit 23 may be located on the upper right side of the third pixel unit 23. The first data line 11 may be used to transmit data signals to the first pixel unit 21 and the third pixel unit 23. The second pixel unit 22 and the fourth pixel unit 24 may be in the same pixel unit group. The TFT 201 of the second pixel unit 22 may be located on the upper right side of the second pixel unit 22. The TFT 401 of the fourth pixel unit 24 may be located on the lower left side of the fourth pixel unit 24. The second data line 12 may be used to transmit data signals to the second pixel unit 22 and the fourth pixel unit 24. The locations and arrangement of the TFTs, i.e., the TFTs 101-401, relative to the pixel units, may be determined or adjusted according to different applications and designs. The TFTs described in the present disclosure are each marked with a dashed box and the corresponding reference number in FIGS. 4 and 5.

In some embodiments, for illustrative purposes, the portion of the common electrode line 2 aligned substantially perpendicular to the direction the data lines 1 are aligned may not be shown in the figures. Because longer common electrode lines 2 and longer pixel electrode lines 3, substantially along the length direction of the data lines, can be obtained, the total capacitance of the storing capacitors formed by the common electrode lines 2 and the pixel electrode lines 3 would not be impaired, and the aperture ratio of the pixel region can be increased. Meanwhile, more light can be transmitted to the pixel region so that the power consumption of the backlight source can be reduced.

Compared to an existing array substrate, for providing storing capacitors with a same capacitance, the disclosed common electrode lines 2 and the pixel electrode lines 3 may be configured with reduced widths. For an array substrate driven by dual-gate drivers, as shown in FIG. 4, the aperture ratio of the pixel region may be increased from about 39.8% to about 41.1%, i.e., may be increased by about 3.3%.

The disclosed array substrate may also be used in array substrates driven by dual-gate drivers with Z-inversion patterns. FIG. 5 illustrates an exemplary configuration of the array substrate. Pixels in the array substrate shown in FIG. 5 are driven by dual-gate drivers with Z-inversion patterns. As shown in FIG. 5, the two pixel units contained in the same pixel unit groups may also each be connected to a different data line 1. For example, the first pixel unit 21 and the third pixel unit 23 may be in the same pixel unit group. The TFT 101 of the first pixel unit 21 may be located on the upper right side of the first pixel unit 21. The TFT 301 of the third pixel unit 23 may be located on the lower left side of the third pixel unit 23. The first data line 11 may be used to transmit data signals to the third pixel unit 23. The second data line 12 may be used to transmit data signals to the first pixel unit 21. The TFT 201 of the second pixel unit 22 may be located on the lower left side of the second pixel unit 22. The TFT 401 (not shown) of the fourth pixel unit 24 may be located on the upper right side of the fourth pixel unit 24. The second data line 12 may be used to transmit data signals to the second pixel unit 22. Another data line (not shown), e.g., a third data line, may be used to transmit data signals to the fourth pixel unit 24. The locations and arrangement of the TFTs, relative to the pixel units, may be determined or adjusted according to different applications and designs.

A common electrode line 2 and the corresponding pixel electrode lines 3 may be disposed between adjacent pixel unit groups. For example, a common electrode line 2 and pixel electrode lines 3 (also shown as the pixel electrode lines 31 and 32 in FIGS. 2-6) may be disposed between the first pixel unit 21 and the second pixel unit 22.

Compared to an existing array substrate, for providing storing capacitors with a same capacitance, the disclosed common electrode lines 2 and the pixel electrode lines 3 may be configured with reduced widths. For an array substrate driven by dual-gate drivers with Z-inversion patterns, as shown in FIG. 5, the aperture ratio of the pixel region may be increased from about 40.9% to about 43.7%, i.e., may be increased by about 6.8%.

In the embodiments described above, no data line 1 is required to be disposed between the first pixel unit 21 and the second pixel unit 22. Space may be formed between the first pixel unit 21 and the second pixel unit 22 for the common electrode line 2 to ensure that the common electrode line 2 can be disposed between the first pixel unit 21 and the second pixel unit 22, and the common electrode line 2 would not block the first pixel unit 21 and the second pixel unit 22. Reduction in light transmission in the first pixel unit 21 and the second pixel unit 22, caused by the formation of storing capacitors, can be avoided.

In some embodiments, between the two adjacent pixel units in different pixel unit groups, e.g., the first pixel unit 21 and the second pixel unit 22 in FIGS. 2, 4, and 5, a first pixel electrode line 31 and a second pixel electrode line 32 may be disposed. The first pixel electrode line 31 may be electrically connected to the pixel electrode of the first pixel unit 21. The second pixel electrode line 32 may be electrically connected to the pixel electrode of the second pixel unit 22. For viewing simplicity, the electrical connections are not shown in FIGS. 2, 4, and 5. The first pixel electrode line 31 and the second pixel electrode line 32 may together be referred to as pixel electrode lines.

Referring to FIG. 3, a cross-sectional view of the structure substantially along the AA' direction in FIG. 2 is illustrated. The pixel electrode 7 of the first pixel unit 21 may be electrically connected to the first pixel electrode line 31, and the pixel electrode 8 of the second pixel unit 22 may be electrically connected to the second pixel electrode line 32. The first pixel electrode line 31 and the second pixel electrode line 32 may form storing capacitors of same capacitances with the common electrode line 2, disposed under the first pixel electrode 31 and the second pixel electrode line 32, to ensure the uniformity of the storing capacitors.

In some embodiments, the total capacitance of the storing capacitors formed by the common electrode lines 2 and their corresponding pixel electrode lines 3 in the disclosed array may account for higher than 30% of the capacitance of the storing capacitors of the array substrate.

In some embodiments, a pixel unit may include a TFT, e.g., the first pixel unit 21 may include a TFT 101. The TFT may include a gate electrode, an active layer, and a source and drain electrode. The gate electrode may be connected to a gate line 4. A gate insulating layer 5 may be disposed on the gate line 4. The active layer, the source and drain electrode, and the data line 1 may be disposed on the gate insulating layer 5. The source electrode may be connected to the data line 1. The drain electrode may be connected to the pixel electrode line 3 and the corresponding pixel electrode.

In one embodiment, the insulating layer between the common electrode line 2 and the corresponding pixel electrode lines 3 may be the gate insulating layer 5. The common electrode line 2 may be located under the pixel electrode line 3. In practice, the specific positions of the common electrode line 2 and the pixel electrode line 3 may be determined or adjusted based on the layers that the common electrode line 2 and the pixel electrode line 3 are located and the relative positions in between, provided that the overlapping areas between the common electrode line 2 and the corresponding pixel electrode lines 3 are sufficient to form a storing capacitor.

The pixel electrode lines 3 may be formed as extended portions of the drain electrodes when the drain electrodes are formed. No additional via hole patterns are needed in the etch mask for forming the pixel electrode line 3. Instead, the via hole patterns corresponding to the drain electrode may be broadened or expanded to form the pixel electrode lines 3. The fabrication process of the array substrate may be simplified. Because the drain electrodes and the pixel electrode lines 3 are electrically connected, it can be ensured that the pixel electrode lines 3 are connected to the pixel electrodes.

In some embodiments, the common electrode line 2 and the gate lines 4 may be formed through a same fabrication step and may be made of a same material. In one embodiment, the pixel electrode lines 3 and the data lines 1 may be formed through a same fabrication step and may be made of a same material.

Figure 6:
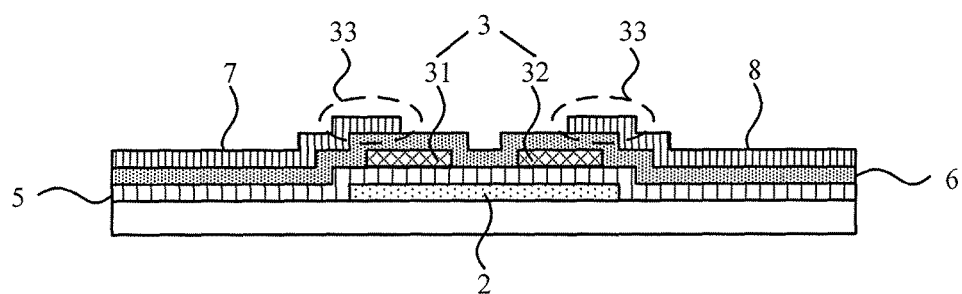
FIG. 6 illustrates a cross-sectional view of another exemplary structure substantially along the AA' direction in FIG. 2 according to various disclosed embodiments of the present disclosure.

By forming the common electrode lines 2 and the gate lines 4 through a same fabrication step and/or forming the pixel electrode lines 3 and the data lines 1 in through a same fabrication step, fabrication process of the array substrate may be simplified. Also, by arranging the common electrode lines 2 and the pixel electrode lines 3 each on a different side of the gate insulating layer 5, as shown in FIGS. 3 and 6, the distance between a common electrode line 2 and the pixel electrode lines 3 may be ensured to be sufficiently small. Thus, storing capacitors with higher capacitance may be formed between the common electrode line 2 and the corresponding pixel electrode lines 3.

In some embodiments, the array substrate may further include a passivation layer 6, disposed on the data lines 1, as shown in FIGS. 3 and 6. The pixel electrodes 7 and 8 may be disposed on the passivation layer 6.

For example, FIG. 6 illustrates a cross-sectional view of another structure substantially along the AA' direction in FIG. 2. In some embodiments, the array substrate may further include extended pixel electrode portions 33, disposed on the passivation layer 6 and electrically connected with the pixel electrodes 7 and 8. The extended pixel electrode portions 33 and the common electrode line 2 may form at least an overlapping area and may also form at least one storing capacitor.

As shown in FIG. 6, the extended pixel electrode portions 33, electrically connected to the pixel electrode 7 of the first pixel unit 21 and the pixel electrode 8 of the second pixel unit 22, may have at least an overlapping area with the common electrode line 2, so that the pixel electrode 7 of the first pixel unit 21 and the pixel electrode 8 of the second pixel unit 22 may form storing capacitors with the common electrode line 2, respectively. The overall capacitance of the storing capacitors of the array substrate may be further increased and improved.

In some embodiments, the array substrate shown in FIG. 6 may further include a source and drain electrode, disposed on the gate insulating layer 5. The pixel electrode line 3 may be an extended portion of the source electrode. The pixel electrode line 3 may also be an extended portion of the drain electrode. The pixel electrode lines 3 may be aligned in parallel to the data line 1.

Another aspect of the present disclosure provides a display apparatus. The display apparatus may incorporate one or more of the above-mentioned array substrates. The display apparatus according to the embodiments of the present disclosure can be an electronic paper, a mobile phone, a tablet, a television, a laptop, a digital frame, a navigator, or any product/parts with display functions.

Another aspect of the present disclosure further includes a method for fabricating an array substrate. The array substrate may be any one of the disclosed array substrates. The method includes forming a plurality of gate lines and a plurality of data lines, the plurality of gate lines intersecting with the plurality of data lines to define a plurality of pixel regions. A pixel region may include two pixel units. A pixel unit may include a pixel electrode. The method may also include forming a common electrode line, the common electrode line being aligned in parallel with the data lines; and forming an insulating layer on the common electrode; and forming a plurality of pixel electrode lines. The pixel electrode lines are aligned in parallel with the data lines and the pixel electrode lines being electrically connected to the pixel electrodes. The common electrode line and a corresponding pixel electrode line form a storing capacitor therebetween.

Figure 7:
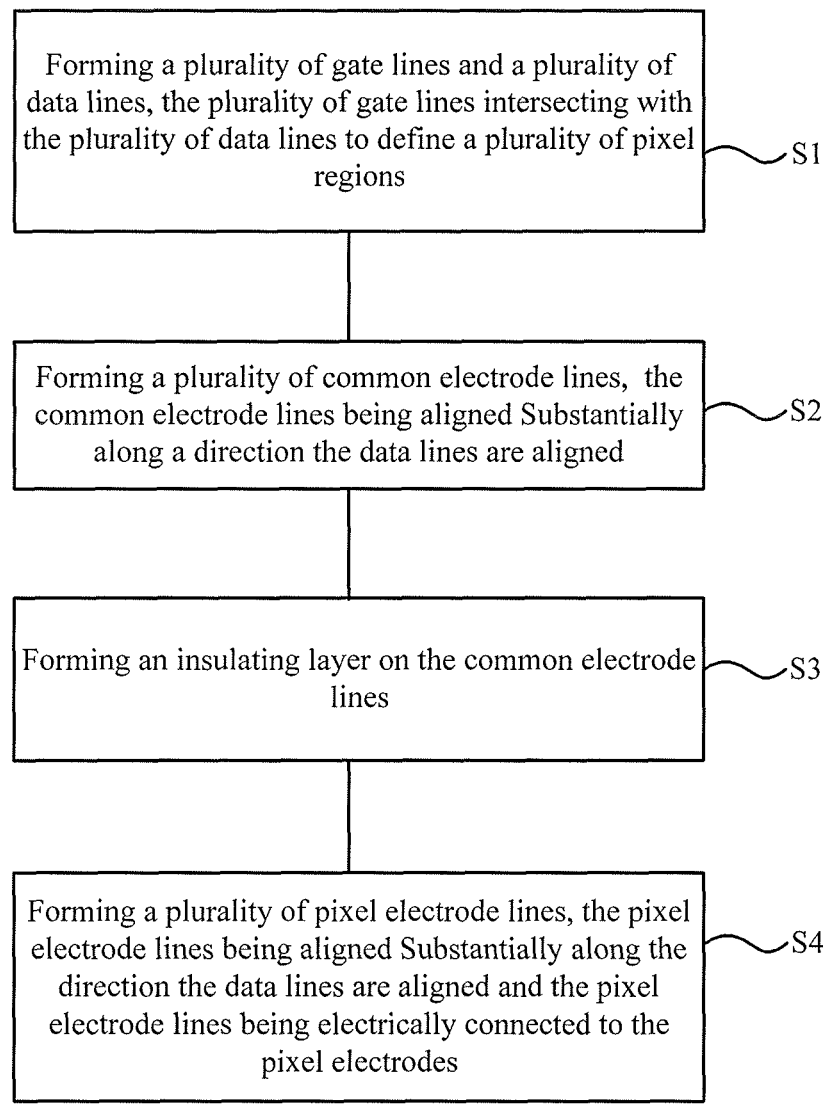
FIG. 7 illustrates an exemplary method for fabricating an array substrate according to various disclosed embodiments of the present disclosure.

As shown in FIG. 7, the method may include steps S1-S4.

In step S1, a plurality of gate lines 4 and a plurality of data lines 1 may be formed. The plurality of gate lines 4 may intersect with the plurality of data lines 1 to define a plurality of pixel regions. A pixel region may include two pixel units, each pixel unit having a pixel electrode.

In step S2, a plurality of common electrode lines 2 may be formed. The common electrode lines 2 may be aligned, for example, substantially along a length direction of the data lines 1.

In step S3, an insulating layer 5 may be formed on the common electrode lines 2. For example, the insulating layer 5 may be formed between the common electrode lines 2 and the subsequently-formed pixel electrode lines 3 such that the pixel electrode lines 3 and the common electrode lines 2 may form storing capacitors there-between.

In step S4, a plurality of pixel electrode lines 3 may be formed. The pixel electrode lines 3 may be aligned substantially along the length direction of the data lines 1. The pixel electrode lines 3 may be electrically connected to the pixel electrodes.

In one embodiment when the common electrode line 2 is formed over the pixel electrode lines 3, step S4 may be performed before step S3, and step S2 may be performed after step S3. The specific order of the fabrication steps may be adjusted according to different applications and designs and should not be limited according to various embodiments of the present disclosure.

In some embodiments, the fabrication process to form the common electrode lines 2 and the pixel electrode lines 3 may include forming a common electrode line 2 and the corresponding pixel electrode lines 3 between adjacent pixel units. The common electrode line 2 and the pixel electrode lines 3 may extend substantially along the length direction of the data lines 1.

In some embodiments, the fabrication process to form the common electrode line 2 and the pixel electrode line 3 may include forming a common electrode line 2 and the corresponding pixel electrode lines 3 between adjacent columns of pixel units. The common electrode line 2 and the pixel electrode lines 3 may extend substantially along the length direction of the data lines 1.

In some embodiments, the fabrication process to form the common electrode lines 2 and the pixel electrode lines 3 may include forming a common electrode line 2 and the corresponding pixel electrode lines 3 between every two columns of pixel units. The common electrode lines 2 and the pixel electrode lines 3 may extend substantially along the length direction of the data lines 1.

In some embodiments, the common electrode lines 2 and the pixel electrode lines 3 may be disposed in different layers, e.g., the common electrode lines 2 may be disposed in a layer under the layer the pixel electrode lines 3 are disposed. In some embodiments, the orthogonal projection of a pixel electrode line 3 on the substrate may be at least partially within the orthogonal projection of a common electrode line 2 on the substrate. In some embodiments, the width of a common electrode line 2 may be larger than or equal to the width of a pixel electrode line 3.

In some embodiments, the fabrication process to form the gate lines 4 may include forming a first gate line 41 over each row of pixel units and forming a second gate line 42 below each row of pixel units. Each row of pixel units may be divided into a plurality of pixel unit groups. The first gate line 41 and the second gate line 42 may be used to drive the two pixel units from different pixel unit groups. Each pixel unit may only be contained in one pixel unit group.

The two pixel units from different pixel unit groups may be connected to the same data line 1, as shown in FIG. 4. Also, the two pixel units from different pixel unit groups may be connected to different data lines 1, as shown in FIG. 6.

The fabrication process to form the common electrode lines 2 may include forming a common electrode line 2 between adjacent pixel unit groups.

The fabrication process to form the pixel electrode lines 3 may include forming pixel electrode lines 3 between adjacent pixel unit groups.

In some embodiments, the fabrication process to form the pixel electrode lines 3 may include forming a first pixel electrode line 31 and a second pixel electrode line 32 between adjacent first pixel unit and second pixel unit, where the first pixel unit and the second pixel unit may be contained in different pixel unit groups in a same row. The first pixel electrode line 31 may be electrically connected to the pixel electrode 7 of the first pixel unit. The second pixel electrode line 32 may be electrically connected to the pixel electrode 8 of the second pixel unit.

In some embodiments, the fabrication process may further include forming TFTs. Forming a TFT may include forming a gate electrode, an active layer, and a source and drain electrode. The gate electrode may be connected to a gate line 4. The source electrode may be connected to a data line 1. The drain electrode may be connected to a pixel electrode line 3 and the corresponding pixel electrode.

In some embodiments, the gate lines 4 may be formed when the common electrode lines 2 are formed. The data lines 1 may be formed when the pixel electrode lines 3 are formed.

In some embodiments, as shown in FIG. 6, the fabrication process may further include forming a passivation layer 6 over the data line 1. The pixel electrodes 3 may be disposed on the passivation layer 6. Extended pixel electrode portions 33 may be formed on the passivation layer 6. The extended pixel electrode portions 33 may be electrically connected to the pixel electrode 3, so that the extended pixel electrode portions 33 may form at least an overlapping area and at least a storing capacitor with the corresponding common electrode line 2.

The fabrication processes to form the above-mentioned layers and components, e.g., passivation layer 6 and data lines 1, may include any suitable film-forming processes such as depositions and sputtering processes, and any suitable patterning processes such as photolithography and a subsequent etching process.

It should be noted that, for illustrative purposes, two pixel electrode lines are configured to substantially overlap with the corresponding common electrode line and form storing capacitors with one corresponding common electrode line. However, the number of pixel electrode lines to form storing capacitance with one corresponding common electrode line should be determined according to the applications and designs, provided that more than one pixel electrode line is used to form storing capacitors with a corresponding common electrode line. The overlapping areas between a common electrode line and a pixel electrode line may also be determined according to different applications and designs.

The technical solution to improve the capacitance of storing capacitors in an array substrate provided herein is illustrated through the embodiments of the present disclosure. Considering that the aperture ratio and light transmission rate of the pixel region may be decreased when increasing the capacitance of storing capacitor in an existing array substrate, the present disclosure may improve the capacitance of storing capacitor in the array substrate by forming pixel electrode lines and common electrode lines with suitably reduced widths. The pixel region may have desired aperture ratio. Power consumption of the backlight source can be improved. Meanwhile, the overlapping areas between a common electrode line and the corresponding pixel electrode lines may be increased. The capacitance of the storing capacitors of the disclosed array substrate may be improved.

In addition, according to the technical solution provided by the present disclosure, the pixel electrode lines and the common electrode lines may be designed to have desired widths to ensure a desirably high aperture ratio of the pixel region. The overlapping areas between a common electrode line and the corresponding pixel electrode lines may be improved. The capacitance of the storing capacitor may be further improved.

It should be noted that, in the drawings of the present disclosure, for illustrative purposes, the thicknesses of layers and dimensions of regions may be modified or distorted. It should be noted that, when a first component is referred to be disposed over a second component, the first component may be directly disposed on the second component, or may be indirectly disposed on the second component, i.e., separated from the second component by another object. It should also be noted that, when a first component is referred to be disposed under a second component, the first component may be directly disposed under the second component, or may be indirectly disposed under the second component, i.e., separated from the second component by another object. It should also be noted that, when a first component is referred to be disposed between two other components, the first component may or may not be the only object between the two other components. For example, the first component may or may not be disposed between the two other components with other objects. Similar or same labels and markings indicate similar or same parts in the figures of the present disclosure.

In the present disclosure, the terms "first", "second", "third", and "fourth" are only for descriptive purposes and do not indicate relative significance over one another. The term "plurality" is used to refer a quantity of two or more, and does not have a limit on the exact quantity.

It should be understood that the above embodiments disclosed herein are exemplary only and not limiting the scope of this disclosure. Without departing from the spirit and scope of this invention, other modifications, equivalents, or improvements to the disclosed embodiments are obvious to those skilled in the art and are intended to be encompassed within the scope of the present disclosure.

What is claimed is:

1. An array substrate, comprising:
   a plurality of gate lines and a plurality of data lines intersecting with one another for defining a plurality of pixel regions, each pixel region including two pixel units, each pixel unit including a pixel electrode;
   a common electrode line and at least one pixel electrode line, the at least one pixel electrode line being electrically connected to the pixel electrode; and
   a passivation layer and extended pixel electrode portions, wherein:
   the common electrode line and the at least one pixel electrode line form at least an overlapping area for forming at least one storing capacitor,
   the passivation layer is on the data lines and the pixel electrodes are on the passivation layer,
   the extended pixel electrode portions are on the passivation layer and electrically connected to corresponding pixel electrodes, and
   the extended pixel electrode portions and the common electrode line form at least an overlapping area for forming storing capacitors.

2. The array substrate according to claim 1, wherein the at least one pixel electrode line substantially overlaps with the common electrode line.

3. The array substrate according to claim 1, wherein the common electrode line and the at least one pixel electrode line are between adjacent pixel units, the common electrode line and the at least one pixel electrode line being aligned substantially parallel with the data lines.

4. The array substrate according to claim 3, wherein the common electrode line and the at least one pixel electrode line are between adjacent columns of pixel units.

5. The array substrate according to claim 3, wherein the common electrode line and the at least one pixel electrode line are between every two columns of pixel units.

6. The array substrate according to claim 1, wherein:
   a row of pixel units is divided into a plurality of pixel unit groups, each pixel unit group containing two adjacent pixel units;
   a first gate line is above each row of pixel units and a second gate line is below each row of pixel units, each of the first gate line and the second gate line being configured to drive a different one of the two adjacent pixel units in each pixel unit group; and
   the two adjacent pixel units in each pixel unit group are connected to a same data line or different data lines, the common electrode line and the at least one pixel electrode line being between adjacent pixel unit groups.

7. The array substrate according to claim 6, wherein:
   the at least one pixel electrode line includes a first pixel electrode line and a second pixel electrode line,
   the first pixel electrode line is electrically connected to a pixel electrode of a first pixel unit,
   the second pixel electrode line is electrically connected to a pixel electrode of a second pixel unit, and
   the first pixel unit and the second pixel unit are adjacent to each other and contained in different pixel unit groups in a same row.

8. The array substrate according to claim 1, wherein the pixel unit further includes a thin-film transistor with a gate electrode, an active layer, and a source and drain electrode, the gate electrode being connected to a gate line, the source electrode being connected to a data line, and the drain electrode being connected to a pixel electrode and the at least one pixel electrode line.

9. The array substrate according to claim 1, wherein: the common electrode line and the gate lines are formed by a same fabrication process and are made of a same material; and the at least one pixel electrode line and the data lines are formed by a same fabrication process and are made of a same material.

10. A display apparatus, comprising one or more array substrates according to claim 1.

11. A method for fabricating an array substrate, comprising:
    forming a plurality of gate lines and a plurality of data lines, the plurality of gate lines intersecting with the plurality of data lines to define a plurality of pixel regions, each pixel region including two pixel units, each pixel unit including a pixel electrode;
    forming a common electrode line, the common electrode line being aligned substantially parallel with the data lines;
    forming an insulating layer on the common electrode line;
    forming a plurality of pixel electrode lines, the pixel electrode lines being electrically connected to the pixel electrodes; and
    forming a passivation layer and extended pixel electrode portions,
    wherein:
    the common electrode line and at least one pixel electrode line form at least an overlapping area for forming at least one storing capacitor,
    the passivation layer is disposed on the data lines and the pixel electrodes are disposed on the passivation layer,
    the extended pixel electrode portions are disposed on the passivation layer and electrically connected to pixel electrodes, and
    the extended pixel electrode portions form at least one storing capacitor with the common electrode line.

12. The method according to claim 11, wherein forming the common electrode lines and the pixel electrode lines includes forming a common electrode line and at least one pixel electrode line between adjacent pixel units, the common electrode line and the at least one pixel electrode line being aligned substantially parallel with the data lines.

13. The method according to claim 12, wherein forming the common electrode lines and the pixel electrode lines includes forming a common electrode line and at least one pixel electrode line between adjacent columns of pixel units, the common electrode line and the at least one pixel electrode line being substantially parallel with the data lines.

14. The method according to claim 12, wherein forming the common electrode lines and the pixel electrode lines includes forming a common electrode line and at least one pixel electrode line between every two columns of pixel units, the common electrode line and the at least one pixel electrode line being substantially parallel with the data lines.

15. The method according to claim 12, further including:
dividing a row of pixel units into a plurality of pixel unit groups, each pixel unit group containing two adjacent pixel units;
forming a first gate line over each row of pixel units and a second gate line below each row of pixel units, the first gate line and the second gate line each being configured to drive a different one of the two adjacent pixel units in each pixel unit group; and
connecting the two adjacent pixel units in each pixel unit group to a same data line or different data lines, the common electrode line and at least one pixel electrode line being disposed between adjacent pixel unit groups.

16. The method according to claim 15, wherein forming the at least one pixel electrode line includes forming a first pixel electrode line and a second pixel electrode line, wherein:
the first pixel electrode line is electrically connected to a pixel electrode of a first pixel unit,
the second pixel electrode line is electrically connected to a pixel electrode of a second pixel unit, and
the first pixel unit and the second pixel unit are adjacent to each other and contained in different pixel unit groups in a same row.

17. The method according to claim 11, further including forming a thin-film transistor with a gate electrode, an active layer, and a source and drain electrode, the gate electrode being connected to a gate line, the source electrode being connected to a data line, and the drain electrode being connected to a pixel electrode and a pixel electrode line.

18. The method according to claim 11, wherein the common electrode line and the gate lines are formed by a same fabrication process and are made of a same material; and the at least one pixel electrode line and the data lines are formed by a same fabrication process and are made of a same material.

* * * * *